United States Patent
Heibel

(10) Patent No.: US 12,044,815 B2
(45) Date of Patent: Jul. 23, 2024

(54) FIXED IN-CORE DETECTOR DESIGN USING SIC SCHOTTKY DIODES CONFIGURED WITH A HIGH AXIAL AND RADIAL SENSOR DENSITY AND ENHANCED FISSION GAMMA MEASUREMENT SENSITIVITY

(71) Applicant: Westinghouse Electric Company LLC, Cranberry Township, PA (US)

(72) Inventor: Michael D. Heibel, Broomfield, CO (US)

(73) Assignee: Westinghouse Electric Company LLC, Cranberry Township, PA (US)

( * ) Notice: Subject to any disclaimer, the term of this patent is extended or adjusted under 35 U.S.C. 154(b) by 94 days.

(21) Appl. No.: 17/996,765

(22) PCT Filed: Apr. 22, 2021

(86) PCT No.: PCT/US2021/028543
§ 371 (c)(1),
(2) Date: Oct. 20, 2022

(87) PCT Pub. No.: WO2021/216805
PCT Pub. Date: Oct. 28, 2021

(65) Prior Publication Data
US 2023/0168398 A1  Jun. 1, 2023

Related U.S. Application Data

(60) Provisional application No. 63/013,859, filed on Apr. 22, 2020.

(51) Int. Cl.
*G01T 1/36* (2006.01)
(52) U.S. Cl.
CPC ............... *G01T 1/366* (2013.01); *G01T 1/36* (2013.01)

(58) Field of Classification Search
CPC ................... G01T 1/366; G01T 1/36
See application file for complete search history.

(56) References Cited

U.S. PATENT DOCUMENTS

2013/0285068 A1  10/2013  Heibel et al.

FOREIGN PATENT DOCUMENTS

WO  2021216805 A1  10/2021

OTHER PUBLICATIONS

International Search Report and Written Opinion for International PCT Application No. PCT/US2021/028543, dated Jul. 19, 2021.
(Continued)

*Primary Examiner* — Hugh Maupin
(74) *Attorney, Agent, or Firm* — K&L Gates LLP

(57) ABSTRACT

A system for measuring gamma spectroscopy of a neutron irradiated material includes a plurality of semiconductor sensors. Each of the semiconductor sensors includes a gamma ray receiving surface disposed above a Schottky layer in contact with an n-doped active layer. The receiving surface is configured to emit electrons upon irradiation by gamma rays. The receiving surface contacts an adjustable telescoping mount configured to adjust the distance between the receiving surface and the Schottky layer. The n-doped layer is fabricated to have a thickness designed to pass through electrons having greater than a defined energy. The combination of adjustable receiving surface and active layer thickness define a minimum and maximum energy response of each of the sensors. Multiple sensors may be integrated in an array in which each sensor has its own energy response. An array of such sensors can measure the gamma spectrum of a material irradiated with neutrons.

14 Claims, 7 Drawing Sheets

(56) References Cited

OTHER PUBLICATIONS

Ruddy et al., Development of a Silicon Carbide Radiation Detector, IEEE Transactions on Nuclear Science (Jun. 1, 1998), 45(3):536-541.
Nava et al., Silicon carbide and its use as a radiation detector material, Measurement Science and Technology (Oct. 1, 2008), 19(10):1-25.

FIXED IN-CORE DETECTOR DESIGN USING SIC SCHOTTKY DIODES CONFIGURED WITH A HIGH AXIAL AND RADIAL SENSOR DENSITY AND ENHANCED FISSION GAMMA MEASUREMENT SENSITIVITY

CROSS-REFERENCE TO RELATED APPLICATIONS

This application is a U.S. National Stage Entry under 35 U.S.C. § 371 of International Patent Application No. PCT/US2021/028543, entitled A FIXED IN-CORE DETECTOR DESIGN USING SIC SCHOTTKY DIODES CONFIGURED WITH A HIGH AXIAL AND RADIAL SENSOR DENSITY AND ENHANCED FISSION GAMMA MEASUREMENT SENSITIVITY, filed Apr. 22, 2021, which claims benefit under 35 U.S.C. § 119 (e) to U.S. Provisional Application Ser. No. 63/013,859 filed Apr. 22, 2020, the entire disclosures of which are hereby incorporated by reference herein.

BACKGROUND OF THE INVENTION

1. Field of the Invention

The present invention relates to radiation detectors, and more particularly to an assembly of a plurality of Schottky diodes for measuring fission gamma radiation for power distribution measurements.

2. Description of the Prior Art

Gamma radiation is created by nuclear decay, such as the nuclear fission that occurs in nuclear reactors. Nuclear reactors are equipped with measurement systems to detect and measure gamma radiation. However, the increase in new nuclear fuel and reactor designs present challenges to the ability of existing measurement systems to confirm fuel design performance predictions and to measure operation performance in detail throughout reactor operation in a fuel cycle.

Nuclear reactor design relies on software simulations for core design and fuel performance projections, as well as performance projections for reactor components in both normal operating conditions and in a variety of accident scenarios. The software performance projections are eventually compared to actual measurements under normal operating conditions, or simulations thereof in test reactors, in a commercial or test reactor.

The early generations of light water reactor (LWR) designs utilized miniature fission chambers that continuously measured neutron flux along the length of roughly one third of the fuel assemblies in the reactor to benchmark the power distribution measurement and the core design software methods. This type of measurement system is referred to as a Movable In-core Detector System (MOS), The finely-spaced axial neutron distribution measurement resolution (~2.4 inches) provided by MIDS measurement systems allowed the identification and diagnosis of many fuel performance issues that caused significant reactor operation issues, such as fuel rod bow, debris deposits on the outside of fuel rods that affect heat transferor reactivity, and inlet flow distribution asymmetries. The primary negative operational issues associated with the use of a MIDS is the complexity, required size, and operation and maintenance costs associated with use of the associated piping and sensors.

The current generation of reactor power distribution measurement systems, referred to as fixed in-core detector (FID) systems, rely on a limited number of radiation sensors in fixed axial and radial locations inside the reactor core. FIG. 1 depicts aspects 600 of the use of FID detector systems compared to an MIDS detector system. As indicated on FIG. 1, the signals from a FID sensor represent the average reactor power over the fixed axial region defined by the active length of the sensing element, One example of a typical Rh FID detector system configuration 610 illustrates axial spacing 613 of the detectors at about 12 inches. A second example of an OPARSSEL V detector system configuration 620, illustrates axial spacings 623 of the detectors at about 24 inches. The radial distribution of fuel assembly FID measurements requires, and is constrained to, locations associated with penetrations in the reactor vessel. The necessary averaging and radial distribution location constraints of FID systems makes it difficult to observe the differences between highly localized and detailed measurements versus predicted power distribution and long term operating characteristic. For example, the overlaid flux distribution graph 630, depicts a measured flux distribution versus tracking point or reactor core depth. For data obtained using a multiple MIDS detector configuration 625, a finer resolution of depth versus flux measurement is more readily obtained than would be possible by either Rh FID configuration 610 or OPARSSEL V FIG configure 620. The ability to detect these differences could be crucial qualifying the design of reactors and in the safe operation of both the fuel and the reactor.

Further, the nuclides produced during reactor operation may be detected and determined by the use of various types of spectrographic measurement including neutron and gamma radiation spectroscopy. The accuracy of performing gamma radiation spectroscopy using existing methods and equipment is often limited by the interactions of different radiation energies in the active volume of the detector that produces a continuum of pulse interest. It is also useful to gamma radiation spectrographic sensors that are small enough to place them in a number of locations within a reactor. Disclosed herein is a method and system that will allow a much clearer representation of the gamma energies and intensities being emitted from the material being analyzed than is currently achievable with other solid-state gamma detector spectroscopy systems.

SUMMARY OF THE INVENTION

The following summary is provided to facilitate an understanding of some of the innovative features unique to the embodiments disclosed and is not intended to be a full description. A full appreciation of the various aspects of the embodiments can be gained by taking the entire specification, claims, abstract and drawings as a whole.

An assembly is described herein for in-core power distribution detection that is suitable for power distribution measurements. The assembly includes generally, an elongate housing for placement within a nuclear reactor and a plurality of a solid state gamma radiation detectors. Each detector is positioned axially within the housing in a radially spaced relationship relative to each adjacent detector.

Each gamma radiation detector includes a Schottky diode having an active semiconductor region and a Schottky contact over at least a portion of the active semiconductor region, an Ohmic contact layer under at least a portion of the active semiconductor region, a layer of a Compton and photoelectron source material that reacts with incident gamma radiation to interact with electrons surrounding source atoms of the source material to produce high energy Compton and photoelectric electrons to penetrate into the active region of the Schottky diode through the Schottky contact, the layer of the Compton and photoelectron source material being supported above the Schottky contact, a layer of fluid interposed between the Schottky contact and the layer of the Compton and photoelectron source material, and a first lead extending upwardly from the radiation detector proximate the source material and a second lead extending upwardly from the radiation detector proximate the Ohmic contact layer. The detectors are spaced within the housing such that the first and second leads of each detector are spaced away from the first and second leads of each of the other of the plurality of detectors.

Each detector may be covered by an intermediate layer and an outer layer. In various aspects, the intermediate layer is an aluminum oxide layer. In various aspects, the outer layer is a stainless steel layer.

The distance between the Schottky contact and the layer of the Compton and photoelectron source material in various aspects may be adjusted. In various aspects, the distance may be adjusted to detect only the highest energy prompt fission gamma radiation. For example, the distance may be adjusted to detect fission gamma radiation greater than about 5 MeV.

BRIEF DESCRIPTION OF THE DRAWINGS

The characteristics and advantages of the present disclosure may be better understood by reference to the accompanying figures.

DESCRIPTION OF THE PREFERRED EMBODIMENTS

As used herein, the singular form of "a" "an", and "the" include the plural references unless the context clearly dictates otherwise.

Directional phrases used herein, such as, for example and without limitation, top, bottom left, right, lower, upper, front, back, and variations thereof, shall relate to the orientation of the elements shown in the accompanying drawing and are not limiting upon the claims unless otherwise expressly stated.

In the present application, including the claims, other than where otherwise indicated, all numbers expressing quantities, values or characteristics are to be understood as being modified in all instances by the word "about." Thus, numbers may be read as if preceded by the word "about" even though the term "about" may not expressly appear with the number. Accordingly, unless indicated to the contrary, any numerical parameters set forth in the following description may vary depending on the desired properties one seeks to obtain in the compositions and methods according to the present disclosure. At the very least, and not as an attempt to limit the application of the doctrine of equivalents to the scope of the claims, each numerical parameter described in the present description should at least be construed in light of the number of reported significant digits and by applying ordinary rounding techniques.

Any numerical range recited herein is intended to include all sub-ranges subsumed therein. For example, a range of "1 to 10" is intended to include all sub-ranges between (and including) the recited minimum value of 1 and the recited maximum value of 10, that is, having a minimum value equal to or greater than 1 and a maximum value of equal to or less than 10.

As used herein "axially" means in the direction of or in alignment with an axis. With respect to two or more objects, axially means the objects are positioned along an axis, either in a co-axial alignment or parallel to an axis.

Figure 3:
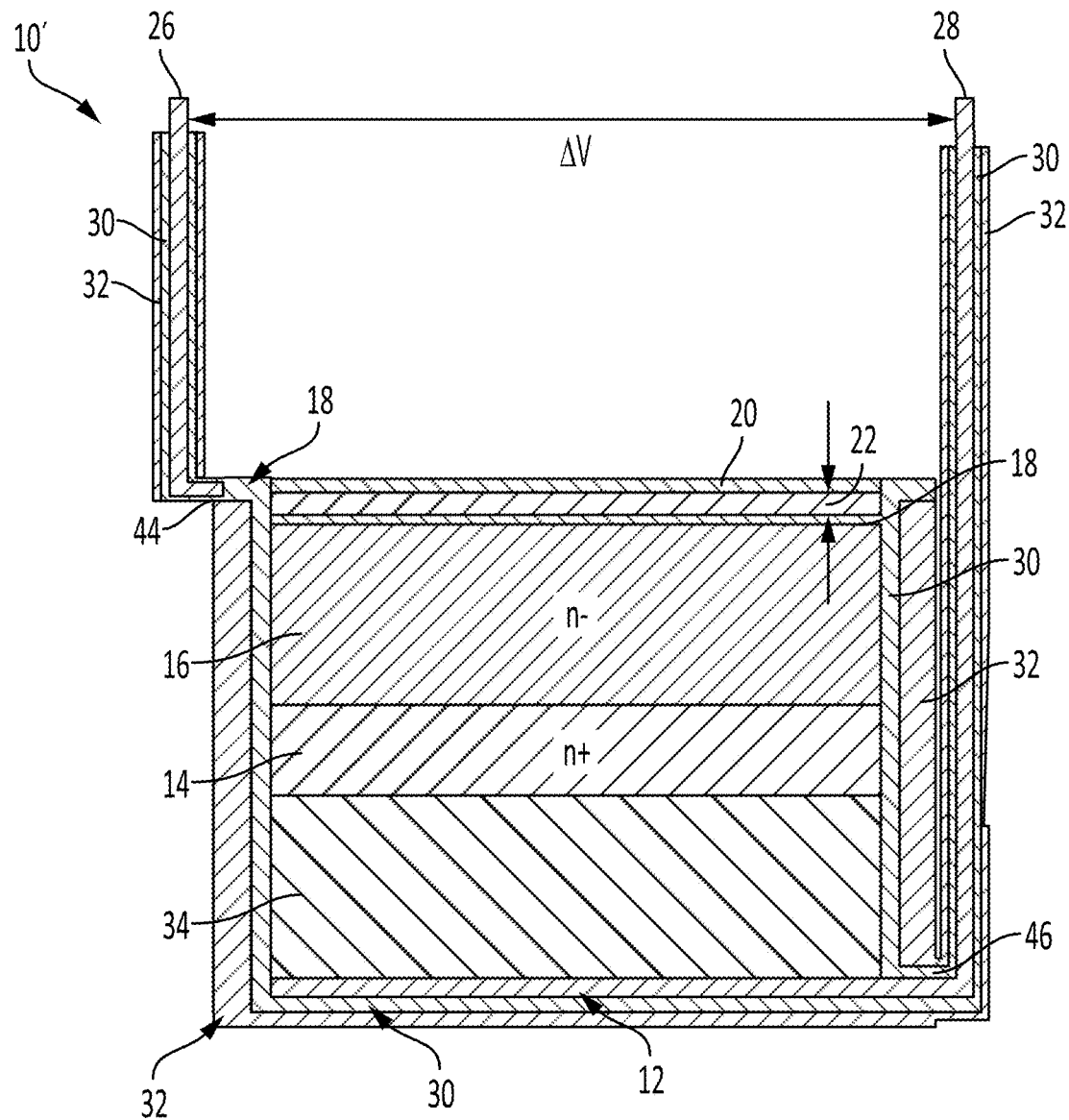
FIG. 3 depicts a side sectional view of a schematic of an exemplary gamma detector used in an exemplary assembly for power distribution detection within a nuclear reactor, in accordance with at least one aspect of the present disclosure.
Figure 4:
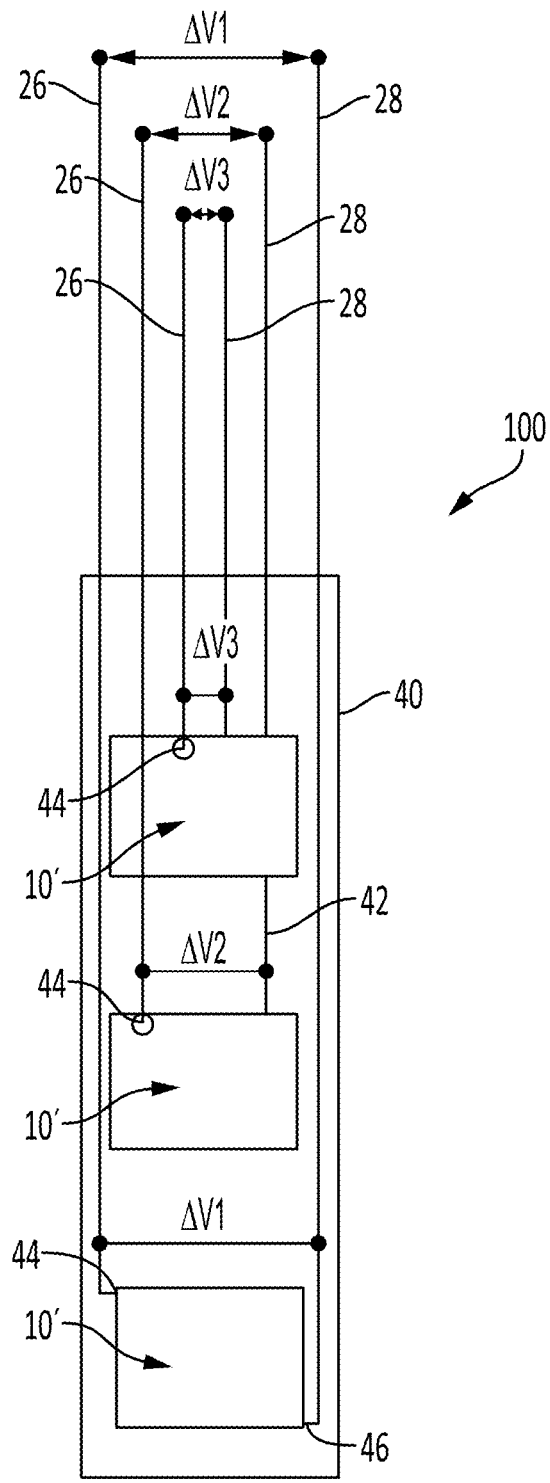
FIG. 4 depicts an axial view of a schematic showing the arrangement of three stacked gamma detectors, rotated relative to each other within a thimble tube for power distribution detection within a nuclear reactor, in accordance with at east one aspect of the present disclosure.

As used herein, "radially spaced" means two or more objects are positioned such that the objects are spaced from each other along an arc of a circle, or placed along a radius, FIG. 4 illustrates an assembly 100 for in-core power distribution detection that is suitable for power distribution measurements for more recent nuclear fuel and reactor designs is described. The assembly 100 uses a plurality of gamma detectors 10' (depicted in FIGS. 3 and 7), preferably positioned axially, one on top of another, within an elongate container, such as a tube 40. The detectors 10' each have two leads 26 and 28. The axial stack of detectors 10' are rotated relative to each other along the length of the elongate container 40 so that the leads of each detector 10' do not interfere with the leads of the other detectors, and to maximize the density of measurements that can be obtained.

Figure 2:
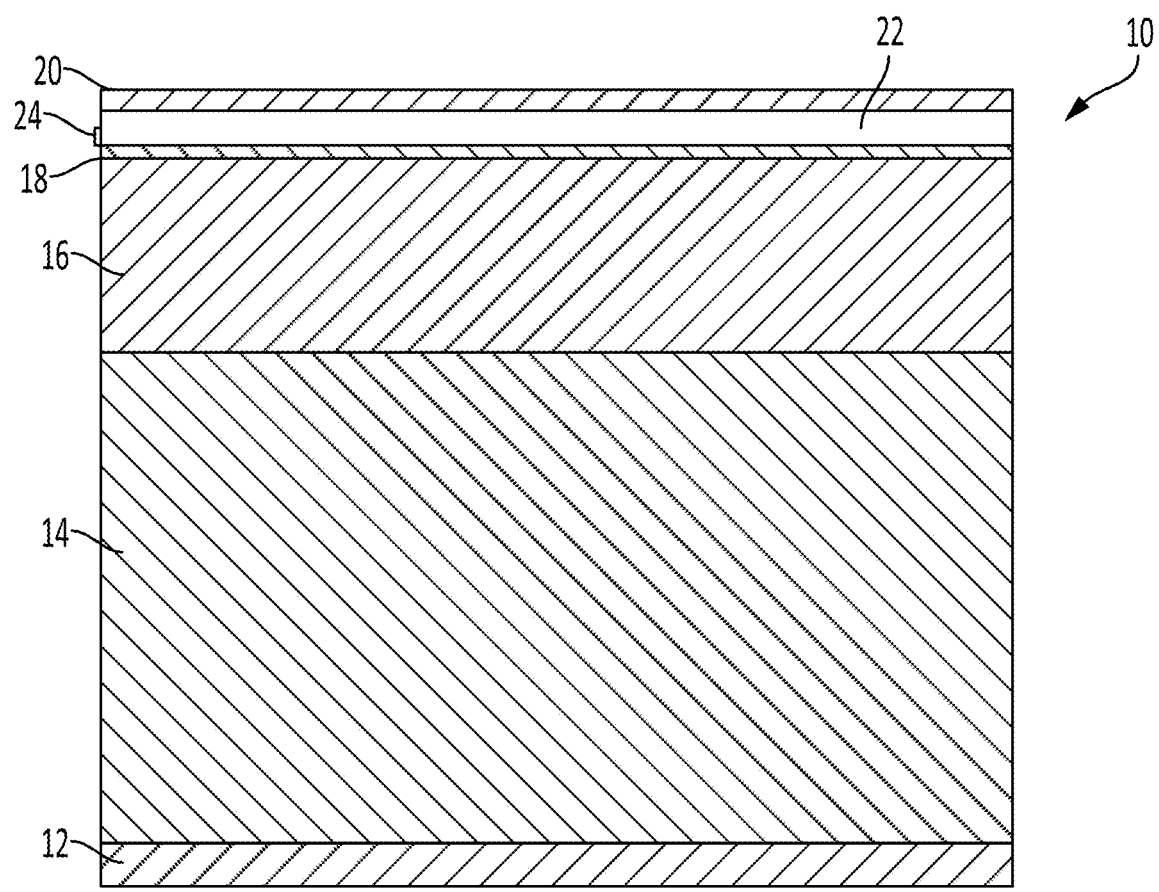
FIG. 2 depicts a side sectional view of an exemplary prior art gamma detector with Schottky contacts, in accordance with at least one aspect of the present disclosure.
Figure 7:
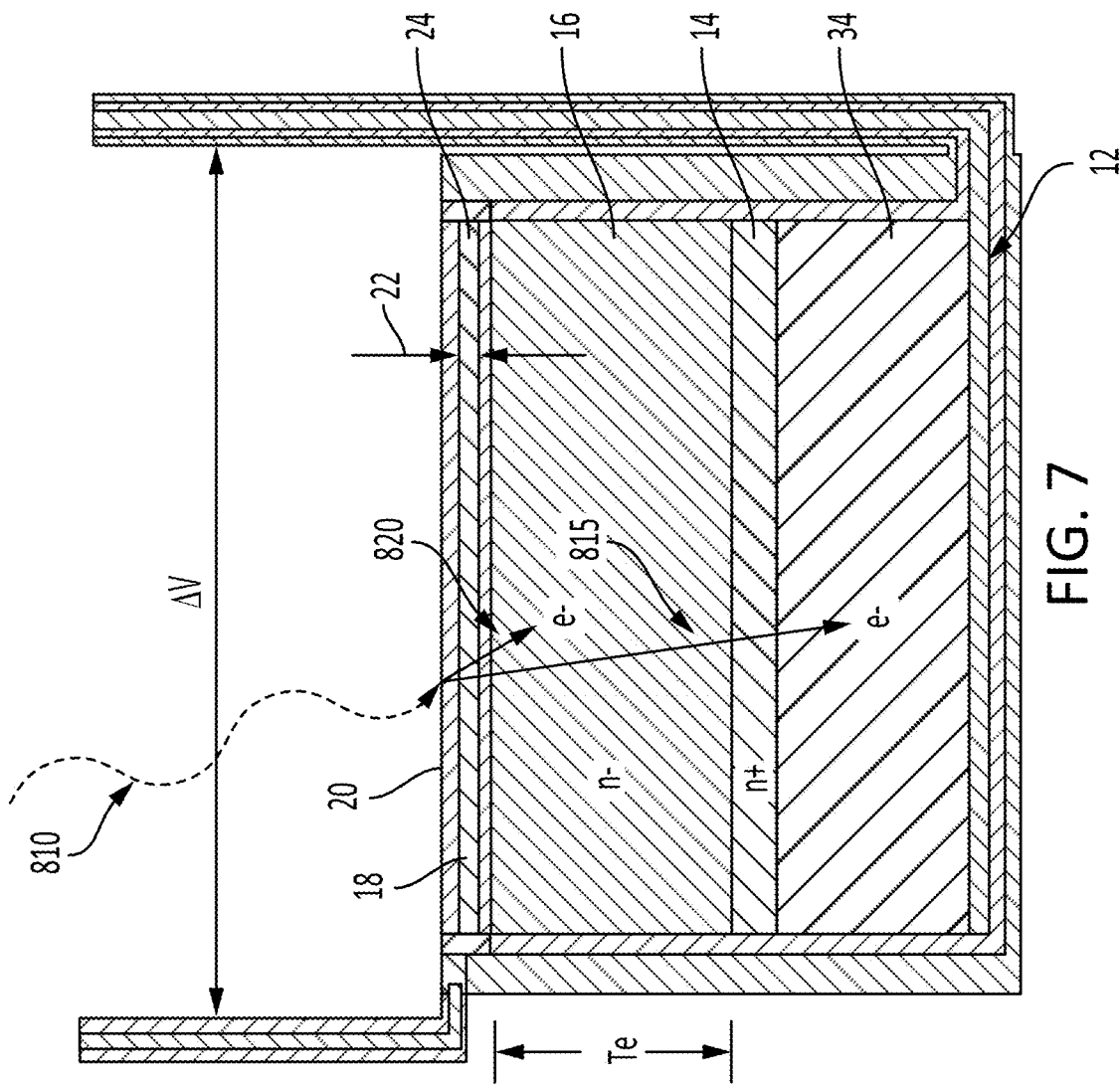
FIG. 7 is the side sectional view of the gamma detector depicted in FIG. 3 used as part of a gamma radiation spectrometer disposed within a nuclear reactor, in accordance with at least one aspect of the present disclosure.

In various aspects, the detectors 10' depicted in FIGS. 3 and 7 may be modifications of those described in U.S. Pat. No. 9,831,375 entitled "Solid State Radiation detector with Enhanced Gamma Radiation Sensitivity" and which is incorporated herein by reference in its entirety and for all purposes. The previously disclosed gamma detector 10, depicted in FIG. 2, may include a Schottky diode having an active semiconductor region and a Schottky contact over at least a portion of the semiconductor region. The detector 10 described herein and in U.S. Pat. No. 9,831,375, includes an Ohmic contact layer 12, made for example of tungsten, positioned beneath a silicon carbide conducting substrate 14, which is covered by a layer of epitaxial silicon carbide 16. The substrate 14 in various aspects is approximately 300 microns in thickness and the epitaxial layer 16 in various aspects is approximately from 3 to 100 microns in thickness. The epitaxial silicon carbide layer 16 is covered by a Schottky contact 18. The Schottky contact 18 may be formed from any highly conductive metal such as platinum or gold, about 1 micron in thickness.

A thin layer of a Compton and photoelectron source material 20, made for example, from platinum or another suitable high atomic donor material, such as lithium fluoride or tungsten, is positioned above and spaced from at least a portion of the Schottky contact 18, defining a gap 22 that will, in response to incident gamma radiation, release electrons that will penetrate the active region 16 and contribute to the collection of charged particles in the region 14. In response to incident gamma radiation, the source or electron radiator material 20 will release electrons that will penetrate the active region 16 and contribute to the collection of charged particles in the active region.

The distance defined by gap 22 between the Schottky contact 18 and added source layer 20 is adjustable, and preferably includes a fluid with a low effective atomic number and negligible conductance, such as the properties of air at 1 atmosphere of pressure with a relative humidity less than or equal to 20 percent at 70° F. (21° C.), between the electron donor layer 20 and the Schottky contact 18. Any such fluid with known density and electron attenuation properties may be used in gap 22.

The gap 22 between the source layer 20 and the Schottky contact 18 ensures that only electrons produced by gamma radiation of a desired energy will contribute to the measured signal.

The material used and the thickness of the source layer 20 are selected based upon the energy range of the gamma radiation that is targeted to be detected by the end-user. The addition of an adjustable electron donor layer (symbolically represented by a telescoping sleeve surrounding the layer 24), i.e., adjustable in thickness and distance from the Schottky contact 18, allows the gamma radiation to interact with the electrons surrounding the source atoms in the donor material 20 to produce high energy Compton and photoelectrical electrons inside the donor layer that penetrate into the active region 16 of the silicon carbide detector 10. The thickness of the intervening fluid in the gap 22 controls the energy of the donor electrons so that they are collected in the active region.

The charge deposited over a fixed amount of time will be proportional to the energy of the gamma radiation incident upon the layer 20, so both gamma energy and gamma radiation intensity can be determined from the proper analysis of the electrical outputs from the silicon carbide device.

As shown in FIGS. 3 and 7, the detector 10 described above may be modified (detector 10') to include an insulating layer 34 between the Ohmic contact layer 12 and the conducting layer 14. The insulating layer 34 prevents discharge of electrons and short circuiting of the tungsten Ohmic contact 12. In various aspects, the active regions of the modified detector 10' include the SiC layers 14 and 16. Epitaxial layer 16 may be made of SiC that has been lightly doped with a source of additional electrons, n−. In this context, light doping may correspond to a concentration of electron donating elements on the order of about $10^{14}$ cm$^{-3}$ to about $10^{16}$ cm$^{-3}$, Conducting layer 14 may be formed from SiC that has been more heavily doped with a source of additional electrons, n+. In this context, heavy doping may correspond to a concentration of electron donating elements on the order of about $10^{18}$ cm$^{-3}$ to about $10^{20}$ cm$^{-3}$. The heavily doped region may insure better electron transport to the ohmic contact. A reverse bias depletes the electrons in the n− region 16 and ionizing radiation produces electron-hole pairs in the depleted region. The charge may then be collected at the ohmic contact under the influence of an applied voltage across the contacts.

In an alternative aspect, the active region may comprise epitaxial layer 16 comprised of two regions, one positively doped layer of about 1 micron in thickness and one negatively doped layer of about 3-10 microns in thickness. The conductive layer 14 may in various aspects include hydrogen ions.

The detectors 10' are very small, less than about 5 mm$^3$. The SiC detectors are preferably configured to only detect the highest energy prompt fission gamma radiation (>~5 MeV) by adjusting the distance between the source material 20 and the n− region of the SiC, epitaxial layer 16.

The exterior surface of detector 10', referring again to FIGS. 3 and 7, is covered by an intermediate layer 30, which in various aspects is made of aluminum oxide ($Al_2O_3$) or magnesium oxide (MgO), and acts as an electrical dielectric and isolates the conductive materials in the detector from each other in addition to the stainless steel enclosure. The intermediate layer 30 is preferably covered by an outer layer 32, made of stainless steel or Iconel™, and which acts as an enclosure providing structural integrity to the detector 10".

A first lead 26, also covered by the aluminum oxide layer 30 and the outer stainless steel layer 32, extends from the top of detector 10' near the source material layer 20 at point 44. A second lead 28, also covered by the aluminum oxide layer 30 and the outer stainless steel layer 32, extends from the bottom of detector 10' near the Ohmic contact layer 12 at point 46. The first and second leads 26 and 28 are on opposite sides of the detector 10'. In a radial configuration, the first and second leads 26 and 28 of a detector 10' may, for example, be positioned 180° apart from each other. The distance between the first and second leads is denoted in FIGS. 3-5 and 7 by ΔV, representing the difference in voltage.

Figure 5:
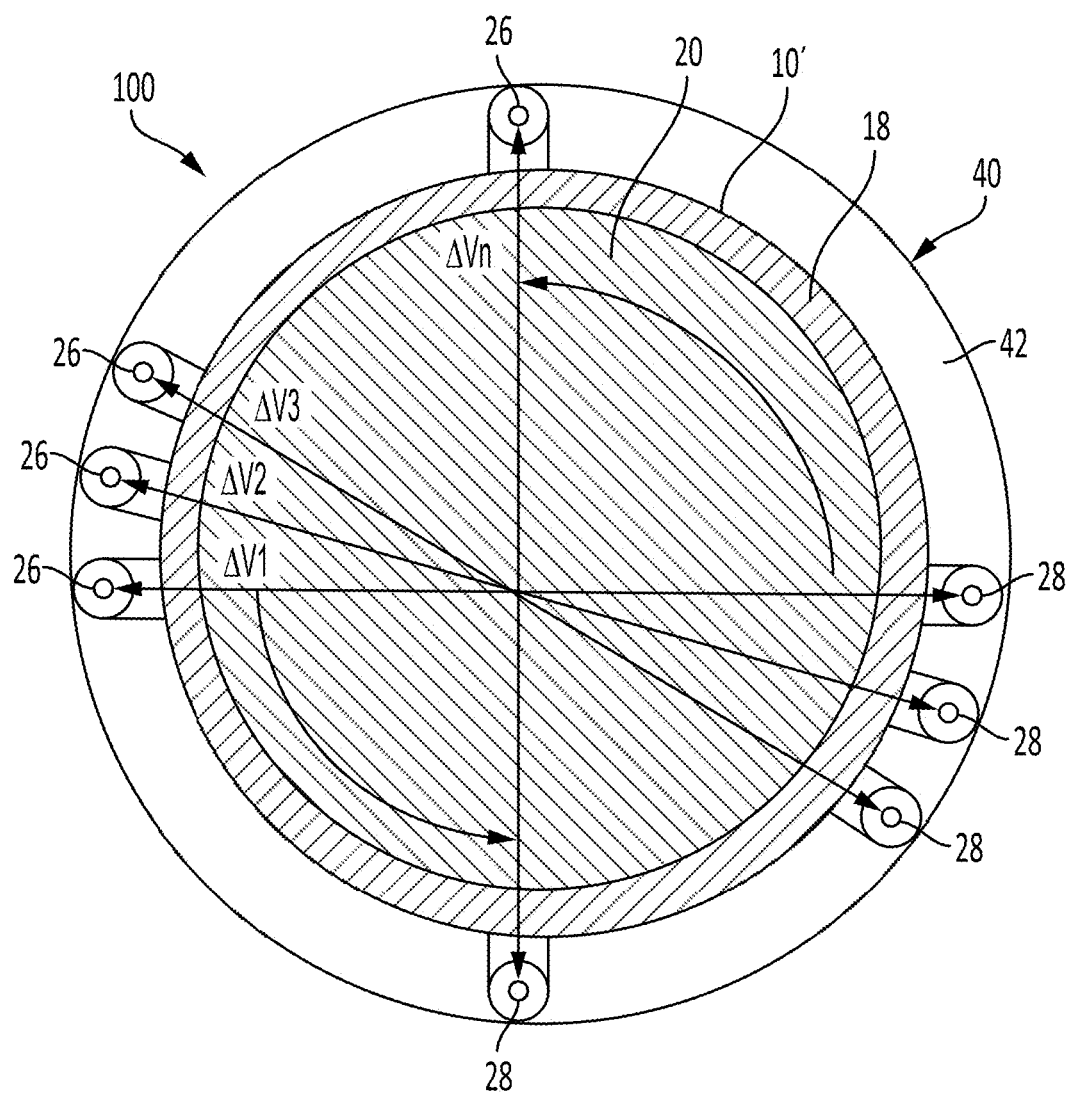
FIG. 5 depicts a top plan view of a stack of a plurality of exemplary gamma detectors within a thimble tube showing a radial view of the arrangement of rotating signal output leads around the perimeter of the thimble tube for power distribution detection within a nuclear reactor, in accordance with at least one aspect of the present disclosure.

FIGS. 4 and 5 illustrate the arrangement of detectors 10' that comprise an embodiment of the assembly 100 for power distribution measurements. The detectors 10' are shown as being housed in an elongate container, such as an instrument tube 40 that would be positioned in use in a reaction vessel, for example, adjacent the fuel rods. A distance between the interior surface of the tube 40 and the exterior surface of the detector 10' defines an open space 42 filled with air, argon or another inert gas.

FIG. 4 is an axial schematic of assembly 100, showing just three axially spaced detectors for illustrations purposes. FIG. 5 is a cross-section view of the assembly 100 shown in FIG. 3, showing the tube 40 and detector 10' arrangement, showing three sets of leads 26/28 separated by distances denoted ΔV1, ΔV2, and ΔV3, and another set denoted by ΔVn, to indicate that n may be any number of additional detectors 10'. In use, there would be a plurality of detectors 10'. For example, as many as 61 detectors 10' can be placed in a typical instrument tube 40 used in a nuclear reactor (not shown), The number of detectors 10' in any tube 40 will vary depending on the length of the tube and the measurement needs of the reactor. The detectors 10' would be arranged such that the leads 26/28 of each detector 10' are radially spaced from the leads 26/28 of the rest of the detectors 10' in the tube 40.

This approach will essentially eliminate the contribution of fission product gamma radiation in the measured signals. In various aspects, the SiC detectors 10' are positioned at different closely spaced positions inside and along the length of a dry tube 40 that has an outer diameter small enough to fit, for example, inside the fuel assembly central instrument thimble or other strategic measurement location inside or around the reactor and/or inside the reactor vessel. As used herein, "closely spaced" means less than about twelve inches, and in various aspects, less than or equal to about two to three inches, and preferably about 2.4 inches or less, equivalent to or less than the spacing in the finely-spaced axial neutron distribution measurement resolution (~2.4 inches) provided by MIDS measurement systems.

Figure 1:
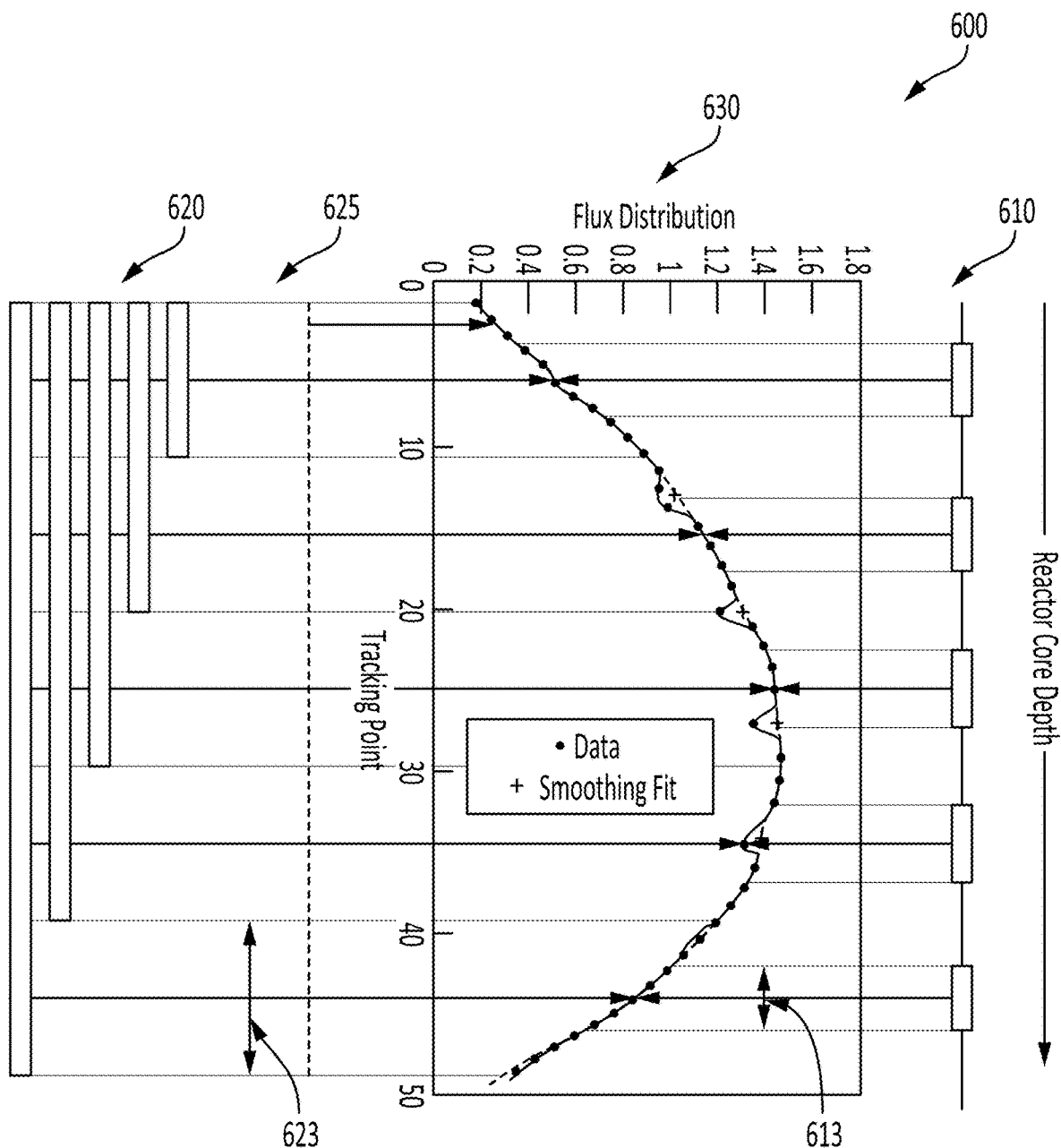
FIG. 1 depicts a graph illustrating measurements of reactor core flux as determined by fixed versus moveable core sensor configurations, in accordance with at least one aspect of the present disclosure.

There is a SIC signal response that will have been predicted by the core design software for each of the many SIC detectors 10' located within or around the reactor core. The use of the small, closely spaced, SiC detectors 10' essentially eliminates the effects of averaging flux measurements over long fuel assembly lengths, as shown in 630 of FIG. 1. As explained previously, the necessary averaging and radial distribution location constraints of the currently used FID systems makes it difficult to observe the differences between highly localized and detailed measurements versus predicted power distribution and long term operating characteristic. The configuration of SiC detectors 10' described herein will closely mimic the distribution of the MIDS movable fission chamber axial measurement density (e.g. —one per 2.4 inches), and will have the ability to resolve the impacts that the presence of things like grids, debris deposits on the outside of fuel rods that affect heat transfer or reactivity (e.g., CRUD), and local boiling have on the reactor core. This allows a more accurate synthesis of the axial flux distribution to be developed. The differences between the measured and predicted detector 10' signals can be used to determine the accuracy of the core design modeling tools in high detail, and produce a highly detailed core power distribution measurement that can be used to identify the presence of fuel performance anomalies.

The detector 100 assemblies can be positioned permanently inside all of the fuel assembly instrument thimbles or inside prepared positions in the reactor fuel matrix.

The signal leads 26/28 used to output the detector signals in the detector tubes 40 are oriented as shown on FIGS. 4 and 5 to allow the maximum possible SiC sensing element active volume surface area and axial density while using standard minerally insulated cable designs for the signal leads. The SiC signals will utilize a common reactor ground to simplify the configuration of the electrical connector that joins the measured voltage differences to the signal processing electronics.

The novel aspects of the detector assembly 100 design described and shown herein includes, for example:

1. The use of a rotating arrangement as a function of axial position of the detectors 10' inside the tube 40 maximizes the number of identical detectors 10' that can be contained within the tube 40 and minimizes the required outer diameter of the dry tube 40.
2. The use of SiC detectors 10' in assembly 100 that are tuned by adjusting gap 22 in each detector 10' to detect the maximum energy prompt fission gamma energies allows a continuous measurement of the reactor fission power distribution. This prompt fission information can be used for reactor anomaly detection, continuous power distribution monitoring, and reactor protection from a single sensor design.
3. The use of the gamma sensitive SIC detector 10' assembly 100 design may allow this assembly to remain in service for the life of the reactor since there are no components that should degrade or diminish as a function of radiation exposure.
4. The thermal characteristics of the SiC detector design shown on FIG. 5 may allow use in designs for pressure water reactors, boiling water reactors, high-temperature gas-cooled reactors, and liquid metal cooled reactors.

In principle the radiation detector assembly 100 design and configuration shown in FIGS. 4 and 5 can displace all other radiation sensors used in nuclear reactor operations. Moreover, the effort to transition from current measurement systems to the radiation detector assembly 100 described herein should be very easy and cost effective.

In a nuclear reactor, a rate of flow of the coolant through the fuel channels will be known and can be continuously or periodically measured, as desired, by known techniques. A fission product that would be expected to be present in sufficient amounts in the event of a leak in a cladding tube to generate measurable gamma radiation may be chosen. An exemplary fission product is $La^{140}$ because it is one of the most prevalent fission products in a reactor using $UO_2$ as the fissile material. Further, it may be useful to monitor changes in the presence of other fission products in the coolant that produce relatively low energy gamma radiation, such as the prompt n-γ emitted from $Xe^{135}$. Since this product may be much more likely to escape from the fuel matrix through a fuel cladding defect, it may be present in higher concentrations in the coolant than the $La^{140}$ in the event a leak develops in the fuel cladding. Therefore, it would be useful to employ an array of gamma detectors able to identify the types of gamma-emitting products through spectrometry. Additionally, some neutron irradiated materials may form nuclides capable of emitting gamma radiation. Gamma energy and intensity measurements may provide the information that is needed to determine the composition of the neutron irradiated elements, along with their quantities, using Neutron Activation Analysis (NAA) techniques well known to those skilled in the art.

Figure 6:
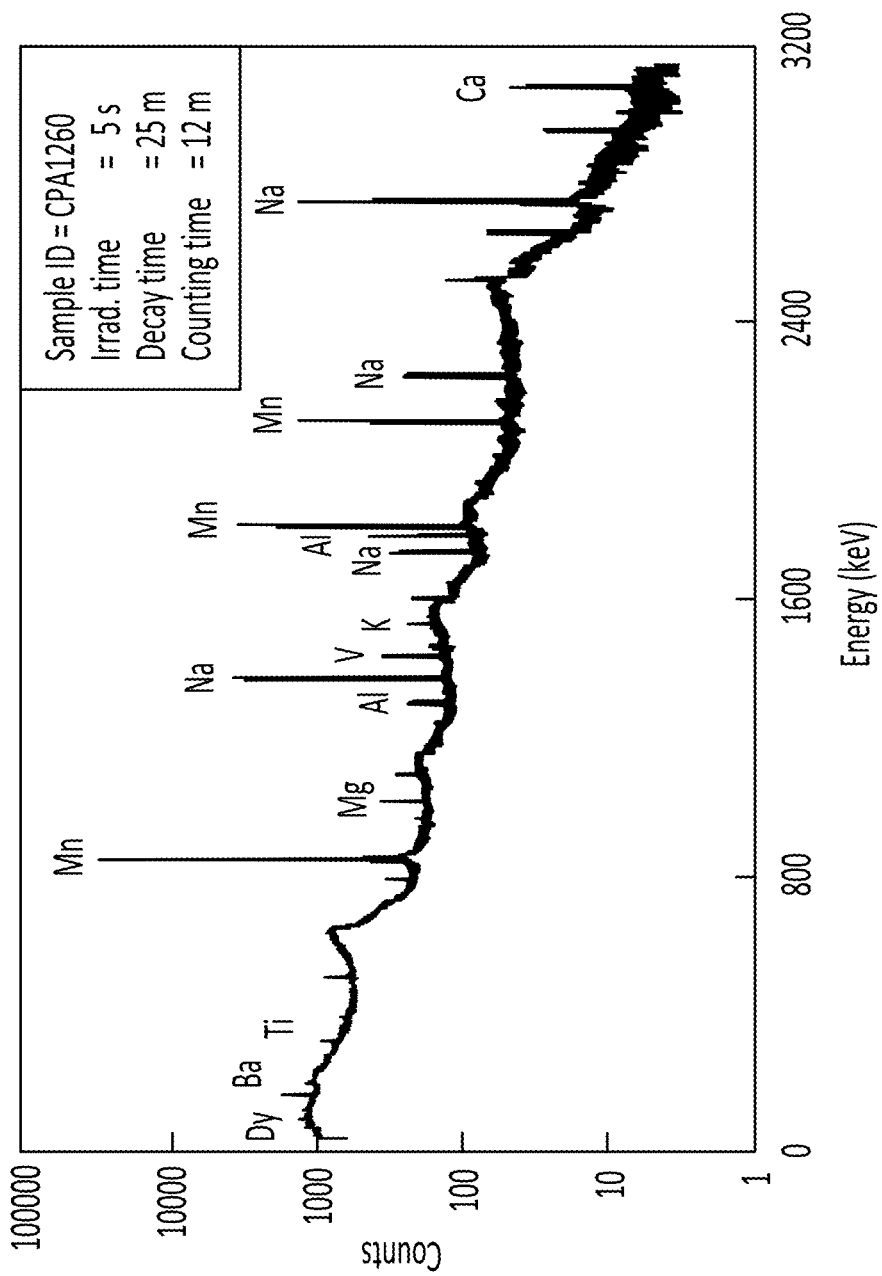
FIG. 6 is a graph of gamma energy versus intensity measurement that may be used to identify the elements present in an irradiated sample using neutron activation analysis, in accordance with at least one aspect of the present disclosure.

Some examples of elements present in a neutron irradiated material sample can be determined by the measurement of a gamma energy spectrum like that shown on FIG. 6. The gamma energy and intensity measurements provide the information that is needed to determine the elements and quantities present in irradiated material using Neutron Activation Analysis (NAA) techniques well known to those skilled in the art. The suppression of the continuum noise observed in FIG. 6 may allow a more accurate determination of the intensity of a single gamma energy peak than is currently achievable using current gamma spectroscopy equipment, Continuum noise suppression may allow a more accurate measurement of fission product concentration changes in the fuel channels as described in U.S. patent application Ser. No. 16/439,061 entitled "Method and System to Detect and Locate the In-Core Position of Fuel Bundles with Cladding Perforations in CANDU-Style Nuclear Reactors" filed Jun. 12, 2019, the contents of which are incorporated herein by reference in their entirety and for all purposes. Such measurements may be useful to identify the presence and axial location of a fuel defect in a fuel channel.

The use of a solid-state radiation detector configured to be particularly sensitive to gamma radiation may allow the creation of a gamma radiation spectrogram from a neutron irradiated material sample, such as exemplified in FIG. 6. Such a detector is described in U.S. Pat. No. 9,831,375, previously referenced and further shown schematically in FIGS. 3 and 7. Each SiC detector can be configured as a Single Channel Analyzer (SCA) (e.g. —ORTEC® 550A Single Channel Analyzer) input to allow each detector to cover a very narrow gamma energy range. The energy range may be determined according to the depth of gap 22 between the electron emitter 20 and the Schottky contact 18, and the depth, Te, of the n– active region 16.

The gap 22 between the electron emitter 20 and Schottky contact 18 may include a fluid 24 interposed between the Schottky contact 18 and the layer of the Compton and photoelectron radiation material 20, as disclosed above. Gamma radiation 810 impinging on the electron emitter 20, will create electrons having an energy related to the energy of the impinging gamma radiation 810. Low energy gamma radiation may result in corresponding low energy Compton or photoelectrically scattered electrons. Low energy may be defined as the energy resulting in electrons unable to transit through the entire thickness of gap 22, and therefore will fail to enter into the active n-region 16. As a result, such low energy electrons may not be detected by the SCA. An array of such detector elements may include individual elements, each having a differing thickness of gap 22 between the electron emitter 20 and the Schottky contact 18. Because the size of the gap 22 determines the lower energy cut-off for a detector, the array may include a number of detectors elements that differ in their lower limit energy detection capabilities.

The value of Te, the depth of the n– layer 16, may be chosen to define an upper limit of the Compton or photoelectrically scattered electrons 820 that may be detected by the sensor. Te may be calculated according to following empirical formula given by L. Katz and A. S. Penfold, Rev. Mod. Phys., 24 (1952), p. 28:

$$R_{max}[g/cm^2] = \begin{cases} 0.412\ E_\beta^{1.265-0.0954\ ln(E_\beta)} & 0.01 \le E_\beta \le 2.5\ \text{MeV} \\ 0.530\ E_\beta - 0.106 & E_\beta > 2.5\ \text{MeV} \end{cases}$$

where $E_\beta$ is the maximum beta energy in MeV, The ability to stop beta radiation depends primarily on the number of electrons in the absorber (i.e., the areal density, which is the number of electrons per $cm^2$). Hence, the range when expressed as a density thickness ($g/cm^2$) of the material gives a generic quantifier by which various absorbers can be compared.

It may be understood that all electrons 815 having an energy that results in a transit distance greater than Te along the thickness of the active volume 16 and 14 will produce pulses in the SCA with essentially the same amplitude. These high energy electrons 815 may result from Compton Scattering and the photoelectric effect corresponding to high energy gamma radiation 810 impinging on the electron radiator layer 20. The resultant high energy electrons 815 may have sufficient energy to completely penetrate the thickness, Te, of the active region 16 of the detector to impinge on the back ohmic contact 12. The pulses associated with these events will all have essentially the same pulse amplitude and may be removed by the upper level discriminator component of the SCA. It may be understood that the thickness of Te therefore determines the upper range of energy detected by the sensor.

Mid-energy electrons 820 may be generated by Compton Scattering and the photoelectric effect corresponding to mid energy gamma radiation 810. By definition, the mid energy electrons 820 may be those electrons able to penetrate the gap 22 between the electron radiation layer 20 and the Schottky contact 18 but not transit beyond the active n-region 16. Such electrons may be those that are actively counted by the SCA as having a pulse height less than the maximum pulse height filtered by the upper limit discriminator. An array of detectors can therefore be fabricated from an array of Schottky sensors, each sensor defined by a gap 22 and an active region depth Te. Each sensor may therefore be tuned at both the lower energy end (gap 22 depth) and the higher energy end (thickness of the Te layer). The data from each gamma energy sensor in the SCA array, having differing values of gap 22 and Te, can be combined to produce gamma energy and associated gamma intensity measurements like that shown in the spectrograph of FIG. 6. However, the variation in the gap 22 thickness may reduce the lower continuum signal level from with the measured gamma energy associated with a particular nuclide. This will allow much more sharply defined energy peaks to be detected at lower energy and intensity values.

All patents, patent applications, publications, or other disclosure material mentioned herein, are hereby incorporated by reference in their entirety as if each individual reference was expressly incorporated by reference respectively. All references, and any material, or portion thereof, that are said to be incorporated by reference herein are incorporated herein only to the extent that the incorporated material does not conflict with existing definitions, statements, or other disclosure material set forth in this disclosure. As such, and to the extent necessary, the disclosure as set forth herein supersedes any conflicting material incorporated herein by reference and the disclosure expressly set forth in the present application controls.

The present invention has been described with reference to various exemplary and illustrative embodiments. The embodiments described herein are understood as providing illustrative features of varying detail of various embodiments of the disclosed invention; and therefore, unless otherwise specified, it is to be understood that, to the extent possible, one or more features, elements, components, constituents, ingredients, structures, modules, and/or aspects of the disclosed embodiments may be combined, separated, interchanged, and/or rearranged with or relative to one or more other features, elements, components, constituents, ingredients, structures, modules, and/or aspects of the disclosed embodiments without departing from the scope of the disclosed invention. Accordingly, it will be recognized by persons having ordinary skill in the art that various substitutions, modifications or combinations of any of the exemplary embodiments may be made without departing from the scope of the invention. In addition, persons skilled in the an will recognize, or be able to ascertain using no more than routine experimentation, many equivalents to the various embodiments of the invention described herein upon review of this specification. Thus, the invention is not limited by the description of the various embodiments, but rather by the claims.

What is claimed is:

1. A method of fabricating a gamma radiation detector, the method comprising:
   providing a SIC radiation detector comprising:
      a Schottky diode having an active semiconductor region and a Schottky contact over at least a portion of the active semiconductor region;
      a layer of a Compton and photoelectron source material configured to react with incident gamma radiation to emit Compton and photo-electric electrons to penetrate into the active semiconductor region of the Schottky diode through the Schottky contact, the layer of the Compton and photoelectron source material being supported above the Schottky contact; and a layer of fluid interposed between the Schottky contact and the layer of the Compton and photoelectron source material;

adjusting a distance between the Schottky contact and the layer of the Compton and photoelectron source material thereby determining a minimum detection energy of the SIC radiation detector;

fabricating the active semiconductor region to have a specified thickness, thereby determining a maximum detection energy of the SiC radiation detector; and contacting the SiC radiation detector to a charge input of a single channel analyzer.

2. The method of claim 1, wherein providing a SiC radiation detector comprises providing a SiC radiation detector have an n⁻ active semiconductor region.

3. The method of claim 2, wherein providing a SIC radiation detector comprises providing a SiC radiation detector have an n⁺ conduction region disposed below the active semiconductor region.

4. The method of claim 1, wherein adjusting a distance between the Schottky contact and the layer of the Compton and photoelectron source material comprises actuating a telescoping sleeve in contact with the Compton and photoelectron source material surrounding the layer of fluid between.

5. The method of claim 1, wherein fabricating the active semiconductor region to have a specified thickness comprises fabricating the active semiconductor region to have a thickness according to $$R_{max}[g/cm^2] = \begin{cases} 0.412\, E_\beta^{1.265-0.0954\,ln(E_\beta)} & 0.01 \le E_\beta \le 2.5\,\text{MeV} \\ 0.530\, E_\beta - 0.106 & E_\beta > 2.5\,\text{MeV} \end{cases}$$

wherein $E_\beta$ is the maximum in MeV.

6. A method of fabricating a gamma radiation detector array, the method comprising:

providing a plurality of SiC radiation detectors, wherein each of the plurality of SiC radiation detectors comprises:

a Schottky diode having an active semiconductor region and a Schottky contact over at least a portion of the active semiconductor region;

a layer of a Compton and photoelectron source material configured to react with incident gamma radiation to emit Compton and photo-electric electrons to penetrate into the active semiconductor region of the Schottky diode through the Schottky contact, the layer of the Compton and photoelectron source material being supported above the Schottky contact; and a layer of fluid interposed between the Schottky contact and the layer of the Compton and photoelectron source material;

for each of the plurality of SiC radiation detectors, adjusting a distance between the Schottky contact and the layer of the Compton and photoelectron source material thereby determining a minimum detection energy of each of the plurality of SiC radiation detectors;

for each of the plurality of SiC radiation detectors, fabricating the active semiconductor region to have a specified thickness, thereby determining a maximum detection energy of each of the plurality of SiC radiation detectors; and contacting each of the plurality of SiC radiation detectors to a charge input of one of a plurality of single channel analyzers.

7. The method of claim 6, wherein for each of the plurality of SiC radiation detectors, adjusting a distance between the Schottky contact and the layer of the Compton and photoelectron source material comprises adjusting a distance between the Schottky contact and the layer of the Compton photoelectron source material of a first SiC radiation detector that differs from a distance between the Schottky contact and the layer of the Compton photoelectron source material of a second SiC radiation detector.

8. The method of claim 6, wherein for each of the plurality of SiC radiation detectors, fabricating the active semiconductor region to have a specified thickness comprises fabricating an active semiconductor region of a first SiC radiation detector to have a first specified thickness and fabricating an active semiconductor region of a second SiC radiation detector to have a second specified thickness.

9. The method of claim 6, wherein determining a minimum detection energy of each of the plurality of SiC radiation detectors comprises determining a minimum detection energy of a first SiC radiation detector that differs from a minimum detection energy of a second SiC radiation detector.

10. The method of claim 6, wherein determining a maximum detection energy of each of the plurality of SiC radiation detectors comprises determining a maximum detection energy of a first SiC radiation detector that differs from a maximum detection energy of a second SiC radiation detector.

11. A system for measuring energies and amplitudes of gamma radiation, the system comprising:

a plurality of SiC radiation detectors, wherein each of the plurality of SiC radiation detectors comprises:

a Schottky diode having an active semiconductor region and a Schottky contact over at least a portion of the active semiconductor region;

a layer of a Compton and photoelectron source material configured to react with incident gamma radiation to emit Compton and photo-electric electrons to penetrate into the active semiconductor region of the Schottky diode through the Schottky contact, the layer of the Compton and photoelectron source material being supported above the Schottky contact; and a layer of fluid interposed between the Schottky contact and the layer of the Compton and photoelectron source material, wherein, for each of the plurality of SiC radiation detectors, a distance between the Schottky contact and the layer of the Compton and photoelectron source is adjustable, and wherein, for each of the plurality of SiC radiation detectors, the active semiconductor region is fabricated to have a specified thickness, thereby determining a maximum detection energy of each of the plurality of SiC radiation detectors; and a plurality of single channel analyzers, wherein a charge input of each of the plurality of single channel analyzers is configured to contact one of the plurality of SiC radiation detectors.

12. The system of claim 11, wherein each of the single channel analyzers is configured to apply a reverse bias voltage across its associated SiC radiation detector.

13. The system of claim 11, wherein each of the plurality of SiC radiation detectors comprises an adjustable telescoping sleeve in contact with the Compton and photoelectron source material surrounding the layer of fluid.

14. The system of claim 11, wherein each of the plurality of SiC radiation detectors further comprises an insulating layer between an Ohmic contact layer and the active semiconductor region.

* * * * *